(12) United States Patent
Nakamura et al.

(10) Patent No.: US 9,966,422 B2
(45) Date of Patent: May 8, 2018

(54) ORGANIC ELECTRO-LUMINESCENT DISPLAY DEVICE HAVING PIXEL INCLUDING FIN STRUCTURE

(71) Applicant: Japan Display Inc., Minato-ku (JP)

(72) Inventors: Tomoki Nakamura, Minato-ku (JP); Jun Hanari, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/298,414

(22) Filed: Oct. 20, 2016

(65) Prior Publication Data
US 2017/0170250 A1    Jun. 15, 2017

(30) Foreign Application Priority Data

Dec. 15, 2015  (JP) .................. 2015-244547

(51) Int. Cl.
*H01L 29/08* (2006.01)
*H01L 27/32* (2006.01)
*H01L 51/52* (2006.01)
*H01L 27/12* (2006.01)
*H01L 29/78* (2006.01)

(52) U.S. Cl.
CPC ........ *H01L 27/3262* (2013.01); *H01L 27/322* (2013.01); *H01L 27/3272* (2013.01); *H01L 51/5221* (2013.01); *H01L 51/5234* (2013.01); *H01L 27/1214* (2013.01); *H01L 29/785* (2013.01)

(58) Field of Classification Search
CPC ............. H01L 27/3262; H01L 27/3272; H01L 27/322; H01L 51/5221; H01L 51/5234
See application file for complete search history.

(56) References Cited

U.S. PATENT DOCUMENTS

| 2009/0021158 A1* | 1/2009 | Tanaka | ................ H01L 51/5215 313/504 |
|---|---|---|---|
| 2015/0155525 A1 | 6/2015 | Sato | |
| 2016/0111686 A1 | 4/2016 | Sato | |
| 2017/0125740 A1* | 5/2017 | Lee | ........................ H01L 27/322 |

FOREIGN PATENT DOCUMENTS

| JP | 10-50477 | 2/1998 | |
|---|---|---|---|
| JP | 2007-80576 | 3/2007 | |
| JP | 2007080576 A | * 3/2007 | ......... H01L 25/0753 |
| JP | 2015-109190 | 6/2015 | |

* cited by examiner

*Primary Examiner* — Matthew Gordon
(74) *Attorney, Agent, or Firm* — Oblon, McClelland, Maier & Neustadt, L.L.P.

(57) ABSTRACT

An organic EL display device includes a substrate, a fin structure on the substrate, the fin structure standing upright in a thickness direction of the substrate, a first electrode formed on at least a part of a side surface of the fin structure, an organic film which is laminated so as to cover a surface of the first electrode on the side surface of the fin structure, a second electrode that is transparent and laminated so as to cover a surface of the organic film on the side surface and a top portion of the fin structure, a color filter layer that is formed on a path that light travels after being emitted from the light emitting layer and passing through the second electrode and formed at least above the organic film laminated on the side surface, and a light blocking layer configured to block light formed above the top portion of the fin structure.

11 Claims, 9 Drawing Sheets

ORGANIC ELECTRO-LUMINESCENT DISPLAY DEVICE HAVING PIXEL INCLUDING FIN STRUCTURE

CROSS-REFERENCE TO RELATED APPLICATION

The present application claims priority from the Japanese Application JP 2015-244547 filed on Dec. 15, 2015, the content of which is hereby incorporated by reference into this application.

BACKGROUND OF THE INVENTION

1. Field of the Invention

The present invention relates to an organic electro-luminescent display device.

2. Description of the Related Art

In recent years, there has been developed a technology for enhancing luminance in an organic electro-luminescent display device using an organic electro-luminescent (EL) element. For example, in Japanese Patent Application Laid-open No. Hei 10-50477, it is disclosed that, on an insulating substrate of glass or other materials, a plurality of pairs of opposing electrodes are formed into a comb shape so as to face each other, and an EL light emitting layer containing a hole transport material and an electron transport material is formed between the plurality of pairs of electrodes.

Further, in Japanese Patent Application Laid-open No. 2007-80576, the following display device is disclosed. In a so-called bottom-emission EL device, light-transmissive support bars are formed. On the entire outer surface of each of the support bars, an anode, a hole transport layer, a light emitting layer, and a cathode are sequentially laminated to form an EL bar having a quadrangular prism shape. With this, light emitted from the light emitting bar is extracted from a transparent substrate side.

Further, in Japanese Patent Application Laid-open No. 2015-109190, the following organic electro-luminescent display device is described. A first electrode, a light emitting layer, and a second electrode are sequentially laminated on a side surface of a convex pedestal, and light emitted from the light emitting layer is transmitted between the first electrode and the second electrode so as to pass through a transmission portion formed above an upper end portion of the pedestal.

SUMMARY OF THE INVENTION

When the electrodes for causing the EL element to emit light are formed into a comb shape as in Japanese Patent Application Laid-open No. Hei 10-50477, and when the organic EL element has bottom-emission structure as in Japanese Patent Application Laid-open No. 2007-80576, the area contributing to light emission is reduced as compared to a top-emission element. Further, when the cathode electrode is made of a non-transparent material as in Japanese Patent Application Laid-open No. 2015-109190, the cathode electrode blocks the light, and thus only part of the emitted light can be extracted.

The present invention has been made in view of the above-mentioned problems, and has an object to provide a display device with high luminance by forming an organic film in a substrate thickness direction to extract light in a laminate side-surface direction.

According to one aspect of the present invention, an organic EL display device includes a substrate, a fin structure on the substrate, the fin structure standing upright in a thickness direction of the substrate, a first electrode formed on at least a part of a side surface of the fin structure, an organic film comprising a light emitting layer, which is laminated so as to cover a surface of the first electrode on the side surface of the fin structure, a second electrode that is transparent and laminated so as to cover a surface of the organic film on the side surface and a top portion of the fin structure, a color filter layer that is configured to transmit light having a certain wavelength, and is formed on a path that light travels after being emitted from the light emitting layer and passing through the second electrode and formed at least above the organic film laminated on the side surface, and a light blocking layer configured to block light formed above the top portion of the fin structure.

In one embodiment of the present invention, the first electrode is laminated so as to further extend on the top portion and on a side surface on a back side of the part of the side surface, and the color filter layer is further formed on a path that light travels after being emitted from the light emitting layer, which is laminated between the first electrode and the second electrode laminated on the side surface on the back side, and passing through the second electrode.

In one embodiment of the present invention, the fin structure is made of the same material as the first electrode.

In one embodiment of the present invention, the organic EL display device further includes a display region comprising a plurality of pixels arranged in a matrix, and each of the plurality of pixels has a plurality of fin structures.

DETAILED DESCRIPTION OF THE INVENTION

Figure 1:
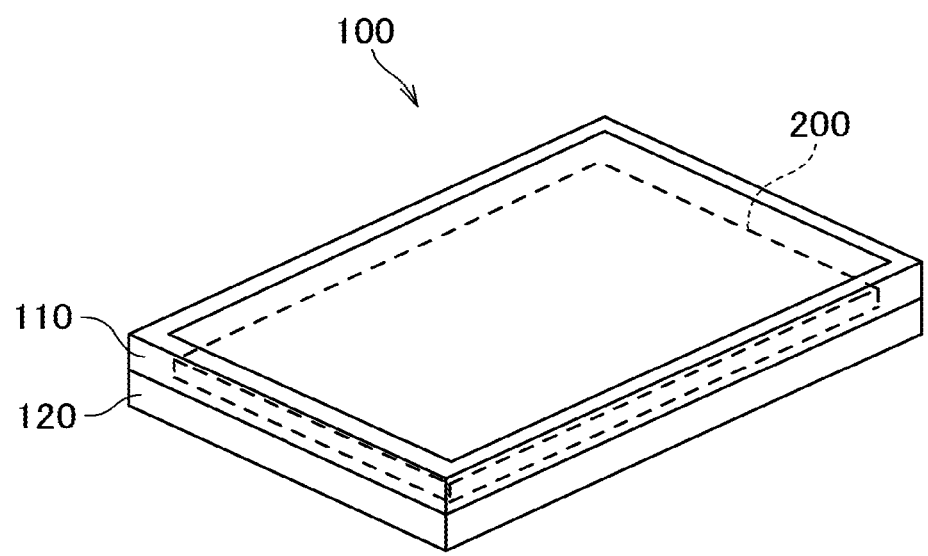
FIG. 1 is a view for schematically illustrating a display device according to an embodiment of the present invention.

Now, embodiments of the present invention are described with reference to the attached drawings. For clearer illustration, some widths, thicknesses, shapes, and the like of respective portions are schematically illustrated in the drawings in comparison to actual dimensions. However, the widths, the thicknesses, the shapes, and the like are merely an example, and do not limit understanding of the present invention. Further, like elements as those described relating to the drawings already referred to are denoted by like reference symbols herein and in each of the drawings, and detailed description thereof is sometimes omitted as appropriate.

FIG. 1 is a view for schematically illustrating a display device 100 according to an embodiment of the present invention. As illustrated in FIG. 1, the display device 100 includes an organic EL panel 200 fixed and sandwiched between an upper frame 110 and a lower frame 120.

Figure 2:
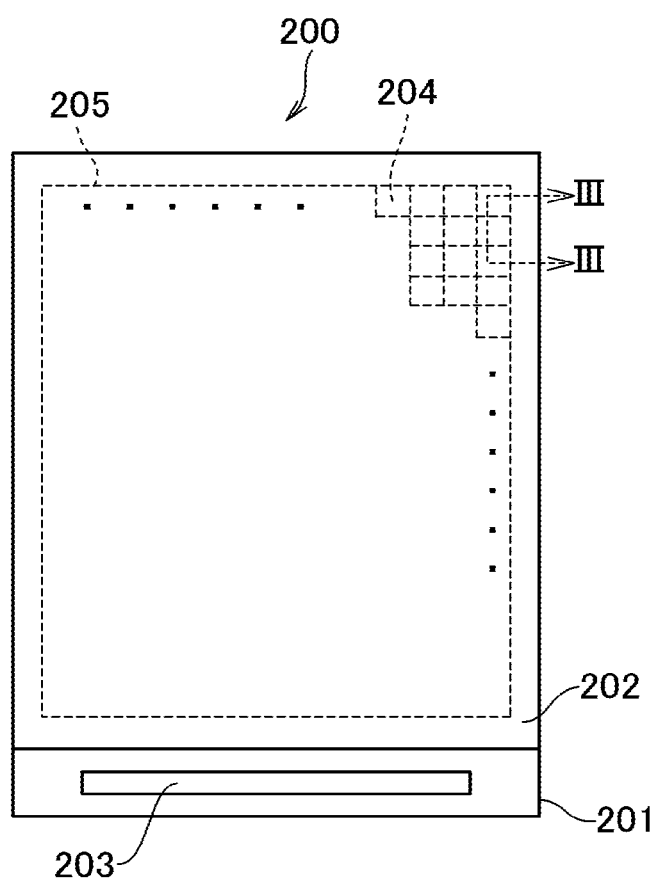
FIG. 2 is a view for illustrating a configuration of an organic EL panel as viewed from a display side thereof.

FIG. 2 is a schematic view for illustrating the configuration of the organic EL panel 200 of FIG. 1. As illustrated in FIG. 2, the organic EL panel 200 includes an array substrate 201, an opposing substrate 202, and a driver IC (integrated circuit) 203. In the array substrate 201, light emitting layers 320, 321, and 322 to be described later and other layers are formed. The array substrate 201 is bonded to the opposing substrate 202 with a filler 318.

The driver IC 203 is configured to, for example, apply a potential for source-drain electrical connection to scanning signal lines of pixel transistors 304 (see FIG. 3 and other figures) formed so as to correspond to a plurality of sub-pixels 204 forming one pixel, and to cause current corresponding to a pixel grayscale value to flow through data signal lines of the respective pixel transistors 304. The driver IC 203 is configured to cause the organic EL panel 200 to display, in a display region 205, a color image formed of the plurality of sub-pixels 204 of a plurality of colors.

Figure 3:
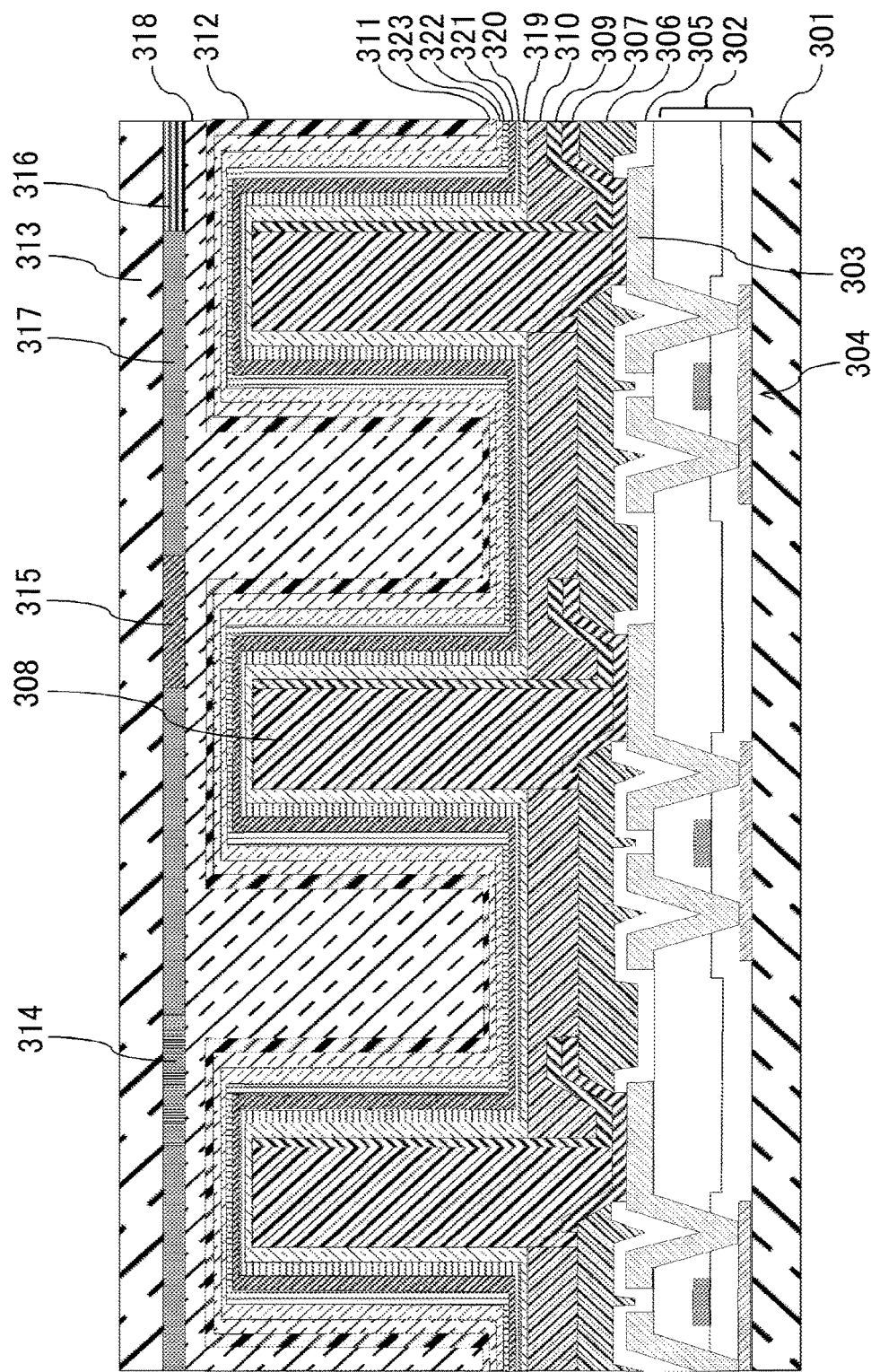
FIG. 3 is a view for illustrating a cross section of a pixel.

FIG. 3 is an example of a view for schematically illustrating a cross section of a pixel according to a first embodiment of the present invention, and is a view taken along the line of FIG. 2. In the following, there is described a case where the plurality of pixels each include a combination of three sub-pixels 204 configured to emit red light, green light, and blue light, respectively. However, the plurality of pixels may each include a combination of four or more sub-pixels 204.

As illustrated in FIG. 3, the array substrate 201 includes a lower glass substrate 301, and further includes a thin film transistor (TFT) circuit layer 302, an inorganic insulating film 305, a first planarizing film 306, a connection electrode 307, a fin structure 308, an anode electrode 309, a second planarizing film 310, an organic film, a cathode electrode 311, and a sealing film 312, which are formed on the lower glass substrate 301 in the stated order toward the opposing substrate 202. The opposing substrate 202 includes an upper glass substrate 313, and further includes color filter layers 314, 315, and 316 and a light blocking layer 317 formed on the upper glass substrate 313. Further, a space between the array substrate 201 and the opposing substrate 202 is filled with the filler 318, and the array substrate 201 and the opposing substrate 202 are bonded to each other with the filler 318.

The TFT circuit layer 302 includes the pixel transistors 304 each including a source electrode, a drain electrode 303, a gate electrode, a semiconductor layer, and the like. Detailed configurations of the pixel transistors 304 are similar to those in the related art, and hence description thereof is omitted herein.

The inorganic insulating film 305 is formed on the upper layer side of the TFT circuit layer 302, and is made of an insulating material so as to prevent the drain electrode 303 from being electrically connected to layers other than the connection electrode 307. The first planarizing film 306 is formed so as to cover the inorganic insulating film 305, and is configured to planarize the steps formed by the wiring and the pixel transistors 304 formed on the lower layer side.

The connection electrode 307 is formed on the upper layer side of the inorganic insulating film 305 and the first planarizing film 306, and is electrically connected to the drain electrode 303 included in the TFT circuit layer 302 via a contact hole formed through the inorganic insulating film 305 and the first planarizing film 306. Further, the connection electrode 307 is formed so as to be electrically connected to the anode electrode 309 formed in the upper layer of the connection electrode 307 for electrical connection between the drain electrode 303 and the anode electrode 309. The drain electrode 303 and the anode electrode 309 may be electrically connected to each other by forming the anode electrode 309 and the drain electrode 303 indirect contact to each other without forming the connection electrode 307.

The fin structure 308 is formed so as to stand upright in the substrate thickness direction. Specifically, for example, as illustrated in FIG. 3, the fin structure 308 is formed toward the upper side of the drawing sheet so as to overlap with a part of the connection electrode 307 and a part of the first planarizing film 306. Further, the fin structure 308 may be made of an inorganic material, or may be made of an organic material. Otherwise, the fin structure 308 may be made of an inorganic material and an organic material formed on the inorganic material.

The anode electrode 309 is formed on at least apart of a side surface of the fin structure 308. Specifically, for example, as illustrated in FIG. 3, the anode electrode 309 is formed so as to be electrically connected to a part of the connection electrode 307, and is formed so as to cover a right side surface of the fin structure 308 in FIG. 3.

The second planarizing film 310 is formed so as to cover a part of the anode electrode 309 and the first planarizing film 306, and is configured to planarize the steps in a region except for a region in which the fin structure 308 and the anode electrode 309 laminated on the side surface of the fin structure 308 are formed.

The organic film is laminated so as to cover the surface of the anode electrode 309 on the side surface of the fin structure 308. Specifically, for example, as illustrated in FIG. 3, the organic film is formed so as to cover the second planarizing film 310, the fin structure 308, and the anode electrode 309 formed on the right side surface of the fin structure 308. Further, the organic film includes the light emitting layers 320, 321, and 322. Specifically, the organic film is formed by laminating a hole injection/transport layer 319, the light emitting layers 320, 321, and 322, and an electron injection/transport layer 323. In this case, the light emitting layers 320, 321, and 322 include the red light emitting layer 320, the green light emitting layer 321, and the blue light emitting layer 322 formed in the stated order from the lower layer side. In FIG. 3, the light emitting layers 320, 321, and 322 are illustrated in the order of the above-mentioned lamination, but the order of the light emitting layers 320, 321, and 322 is not limited thereto. The hole injection/transport layer 319 is formed so as to cover the surface of the anode electrode 309, and is configured to transport the holes injected from the anode electrode 309 to the light emitting layers 320, 321, and 322. Further, the electron injection/transport layer 323 is formed so as to cover the light emitting layers 320, 321, and 322, and is configured to transport the electrons injected from the cathode electrode 311 to the light emitting layers 320, 321, and 322. Then, the light emitting layers 320, 321, and 322 each recombine the holes injected from the anode electrode 309 via the hole injection/transport layer 319 with the electrons injected from the cathode electrode 311 via the electron injection/transport layer 323, to thereby emit light.

The cathode electrode 311 is laminated so as to cover the surface of the organic film on the side surface and a top portion of the fin structure 308. For example, as illustrated in FIG. 3, the cathode electrode 311 is formed so as to cover the entire organic film. Further, the cathode electrode 311 is formed with use of a transparent material. Specifically, for example, the cathode electrode 311 is formed of a metal thin film having a transmissive property, which contains a metal, e.g., indium tin oxide (ITO). The sealing film 312 is formed so as to cover the cathode electrode 311 so as to seal the cathode electrode 311.

The color filter layers 314, 315, 316 are each made of a material that transmits only light having a certain wavelength. Specifically, for example, the color filter layers 314, 315, and 316 include the red color filter layer 314 configured to selectively transmit red light, the green color filter layer 315 configured to selectively transmit green light, and the blue color filter layer 316 configured to selectively transmit blue light. Further, the color filter layers 314, 315, and 316 are each formed above the organic film laminated at least on the side surface of the fin structure 308 and on a path that light travels after being emitted from the light emitting layers 320, 321, and 322 and passing through the cathode electrode 311. Specifically, for example, as illustrated in FIG. 3, the color filter layers 314, 315, and 316 of the respective colors are each formed on the path that the light travels after being emitted from the light emitting layers 320, 321, and 322, which are laminated on the anode electrode 309 formed so as to cover the right side surface of the fin structure 308, and passing through the cathode electrode 311 and the sealing film 312 formed above the light emitting layers 320, 321, and 322 in FIG. 3.

The light blocking layer 317 is configured to block light formed above the top portion of the fin structure 308. Specifically, for example, as illustrated in FIG. 3, the light blocking layer 317 is configured to block, above the top portion of the fin structure 308, light that is emitted from the light emitting layers 320, 321, and 322, which are laminated on the anode electrode 309 formed so as to cover the right side surface of the fin structure 308. Further, the light blocking layer 317 is formed from a portion above the top portion of the fin structure 308 across a region in which the fin structure 308 is not formed, except for a portion above the light emitting layers 320, 321, and 322, which are laminated on the anode electrode 309 formed so as to cover the right side surface of the fin structure 308. That is, the light blocking layer 317 is configured to block light that is emitted from the above-mentioned light emitting layers 320, 321, and 322 and travels in a direction other than the substrate thickness direction. The light blocking layer 317 is configured to prevent a situation where light beams emitted from adjacent sub-pixels 204 are mixed to cause color mixture.

As described above, with the configuration of the present invention, the light extracting direction is an in-plane direction of the formed light emitting layers 320, 321, and 322, and hence light that has been confined in the light emitting layers 320, 321, and 322 can be extracted, resulting in enhanced luminance. Further, it is unnecessary to consider the microcavity effect unlike the related art, and hence the film thickness of the element can be freely designed.

Figure 4:
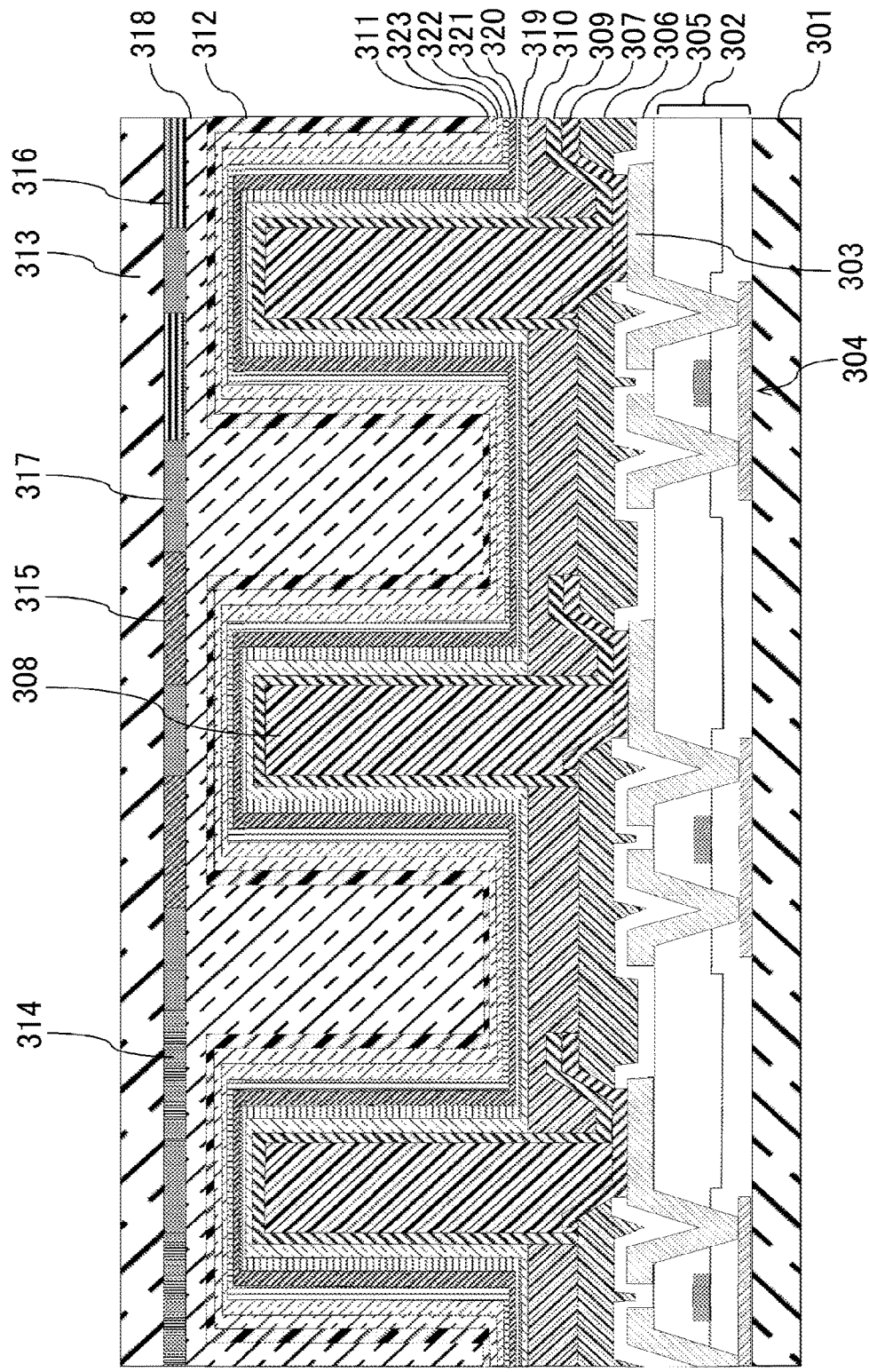
FIG. 4 is a view for illustrating a cross section of a pixel according to another embodiment of the present invention.

In the embodiment described above, the anode electrode 309 is formed so as to cover the right side surface of the fin structure 308, but the shape of the anode electrode 309 is not limited thereto. For example, the anode electrode 309 may be laminated so as to extend on a side surface on the back side of the above-mentioned side surface, and on the top portion of the fin structure 308. Specifically, as illustrated in FIG. 4, the anode electrode 309 may be laminated so as to extend from the right side surface of the fin structure 308 via the top portion of the fin structure 308 to reach the left side surface of the fin structure 308.

In this case, the light emitting layers 320, 321, and 322 are in a state of being formed between the anode electrode 309 and the cathode electrode 311 throughout the entire display region 205. Therefore, the light emitting layers 320, 321, and 322 emit light not only in the laminated region on the right side of the fin structure 308, but also in the entire display region 205. In view of this, the color filter layers 314, 315, and 316 may be each further formed on a path that light travels after being emitted from the light emitting layers 320, 321, and 322, which are laminated between the anode electrode 309 and the cathode electrode 311 laminated on the side surface on the back side, and passing through the cathode electrode 311. With this configuration, not only the light emitted from the light emitting layers 320, 321, and 322 laminated on the right side surface of the fin structure 308, but also the light emitted from the light emitting layers 320, 321, and 322 laminated on the left side surface of the fin structure 308 can be extracted, resulting in more enhanced luminance.

Figure 5:
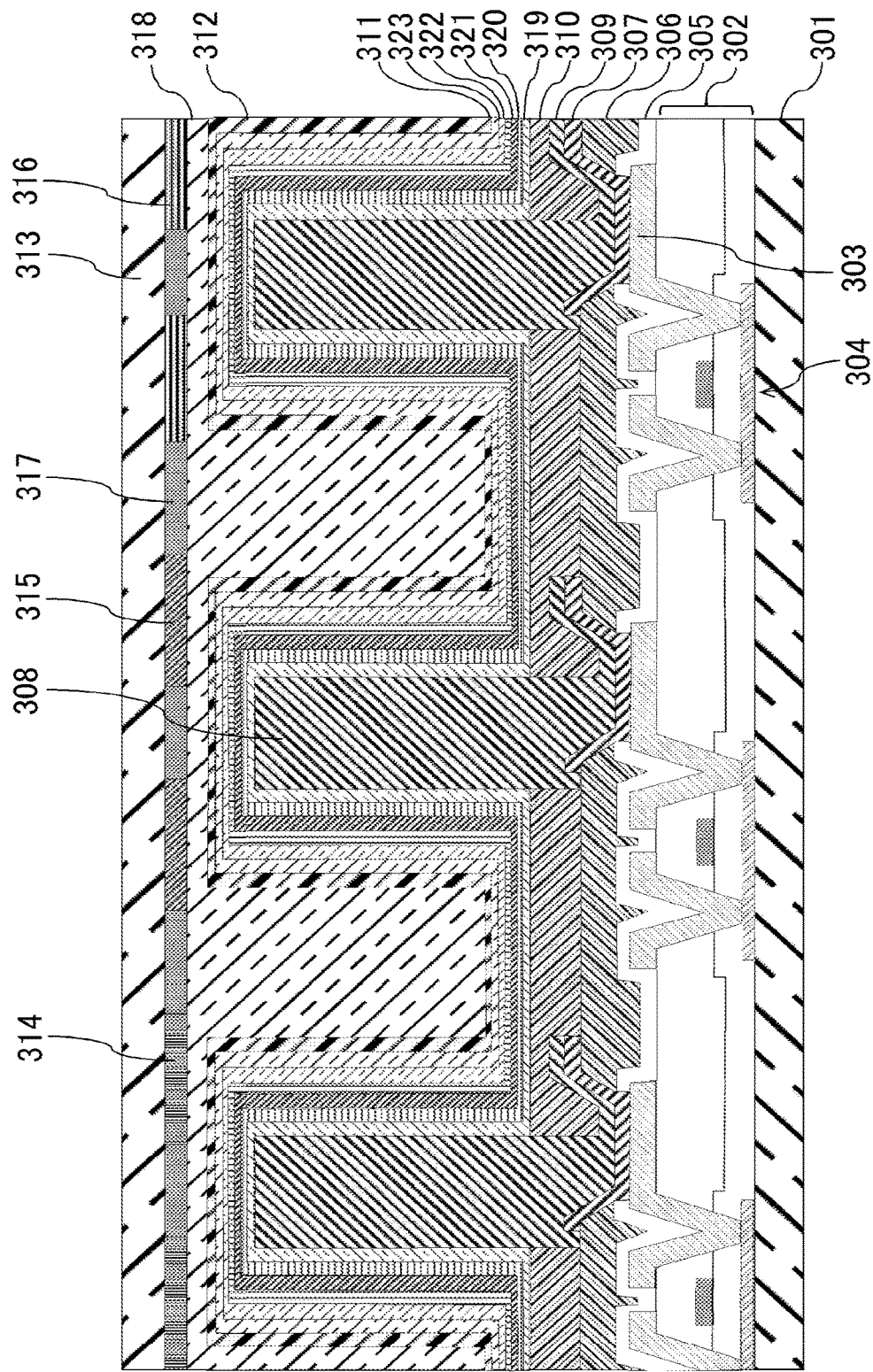
FIG. 5 is a view for illustrating a cross section of a pixel according to still another embodiment of the present invention.

Further, as illustrated in FIG. 5, the fin structure 308 may be made of the same material as the anode electrode 309. Also with this configuration, light can be extracted from regions similar to those in the configuration illustrated in FIG. 4, and hence the luminance can be enhanced. In addition, the anode electrode 309 and the fin structure 308 can be formed in the same step, and hence the load in the manufacturing process can be reduced.

Figure 6A:
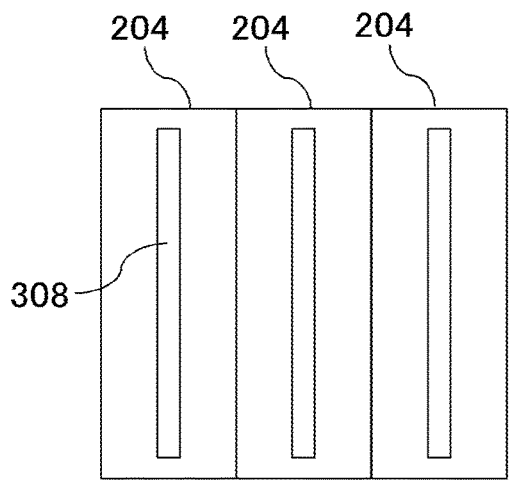
FIG. 6A to FIG. 6F are views for illustrating arrangement layouts of fin structures.
Figure 6B:
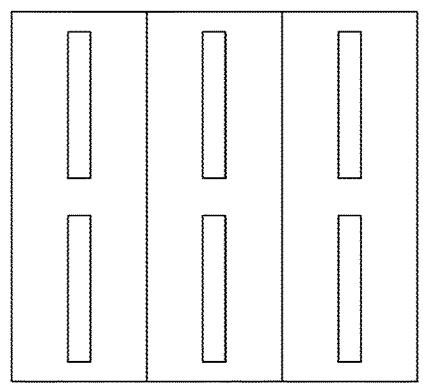
Figure 6C:
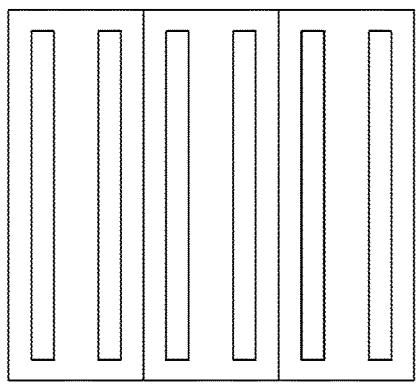
Figure 6D:
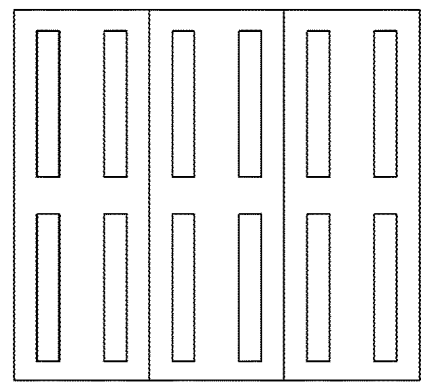
Figure 6E:
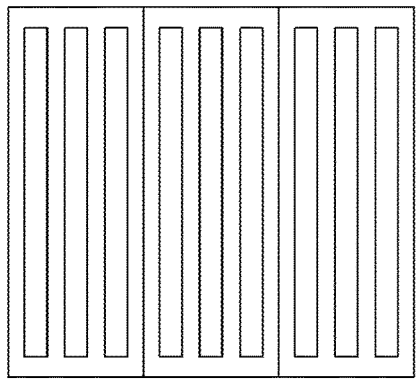
Figure 6F:
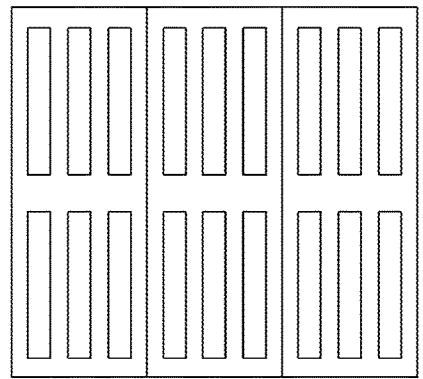

Further, one sub-pixel 204 may include one fin structure 308, or may include a plurality of fin structures 308. FIG. 6A to FIG. 6F are views for illustrating the sub-pixels 204 configured to emit the red light, the blue light, and the green light from the left, and for illustrating arrangement positions of the fin structures 308 formed in the respective sub-pixels. As illustrated in FIG. 6A, one sub-pixel 204 may include one fin structure 308. Further, as illustrated in FIG. 6B, FIG. 6D, and FIG. 6F, the fin structures 308 may be arranged such that two fin structures 308 are formed side by side in the long-side direction of the sub-pixel 204, or as illustrated in FIG. 6C to FIG. 6F, the fin structures 308 may be arranged such that two or three fin structures 308 are formed side by side in the short-side direction of the sub-pixel 204.

Figure 7A:
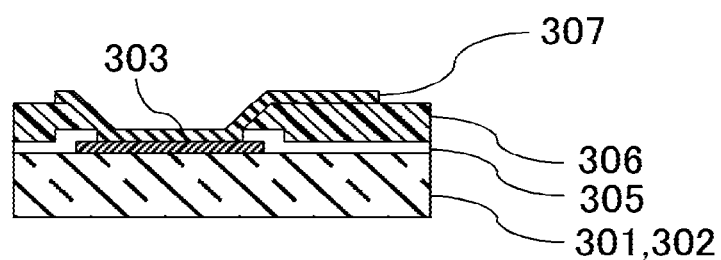
FIG. 7A to FIG. 7D are views for illustrating a flow of manufacturing of an organic electro-luminescent display device.

Next, a manufacturing process for the organic electroluminescent display device according to the present invention is described. FIG. 7A to FIG. 7D are views for illustrating the manufacturing process according to an embodiment of the present invention in which the anode electrode 309 is formed so as to cover the right side surface of the fin structure 308. As illustrated in FIG. 7A, on the lower glass substrate 301, the TFT circuit layer 302 is formed, and then the inorganic insulating film 305 and the first planarizing film 306 are laminated thereon. In FIG. 7A, the illustration of the TFT circuit layer 302 is omitted, and only the drain electrode 303 is illustrated. Then, a contact hole is formed through the inorganic insulating film 305 and the first planarizing film 306 laminated on the drain electrode 303, and the connection electrode 307 is laminated on the drain electrode 303 through the opening portion. In this case, the connection electrode 307 is laminated on the drain electrode 303, to thereby prevent the drain electrode 303 from being exposed in the subsequent steps. Thus, the drain electrode 303 can be prevented from being degraded.

Figure 7B:
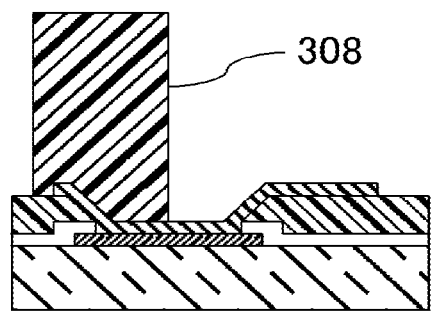
Figure 7C:
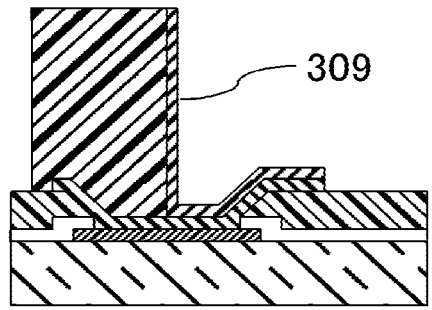

Subsequently, as illustrated in FIG. 7B, the fin structure 308 is formed such that a part of the connection electrode 307 is exposed. Then, as illustrated in FIG. 7C, the anode electrode 309 is laminated on the right side surface of the fin structure 308. In this case, the anode electrode 309 is laminated so as to overlap with the exposed connection electrode 307 as well, to thereby electrically connect the anode electrode 309 and the drain electrode 303 to each other. Further, the anode electrode 309 is etched into a shape as illustrated in FIG. 7C with use of a photolithography technique. At the time of etching, the connection electrode 307 is simultaneously etched to align the end portions of the anode electrode 309 and the connection electrode 307.

Figure 7D:
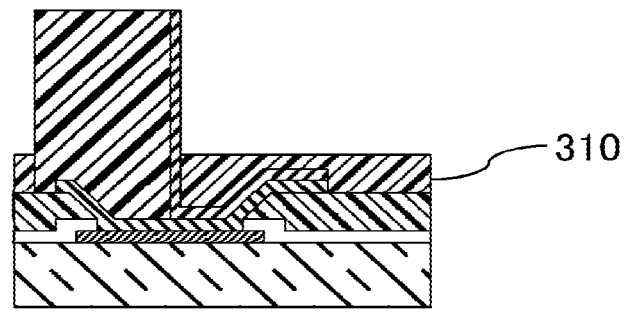

Then, as illustrated in FIG. 7D, the second planarizing film 310 is laminated in the region except for the region in which the fin structure 308 and the anode electrode 309 laminated on the side surface of the fin structure 308 are formed. With this, the anode electrode 309 formed in a planar region is covered with the second planarizing film 310, and the anode electrode 309 is exposed only in a region in which the anode electrode 309 is laminated in the substrate thickness direction. Further, although not shown, the organic film, the cathode electrode 311, and the sealing film 312 are laminated in the stated order on the upper layer side of the anode electrode 309, the fin structure 308, and the second planarizing film 310. Then, the array substrate 201 is bonded to the opposing substrate 202 with the filler 318, to thereby complete the organic EL panel 200. With the above-mentioned process, the anode electrode 309 configured to apply voltage to the light emitting layers 320, 321, and 322 is formed in the substrate thickness direction such that the light extracting direction is the in-plane direction of the formed light emitting layers 320, 321, and 322.

Figure 8A:
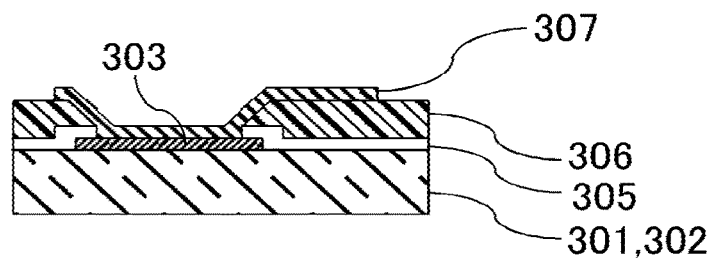
FIG. 8A to FIG. 8D are views for illustrating a flow of manufacturing of an organic electro-luminescent display device according to another embodiment of the present invention.
Figure 8B:
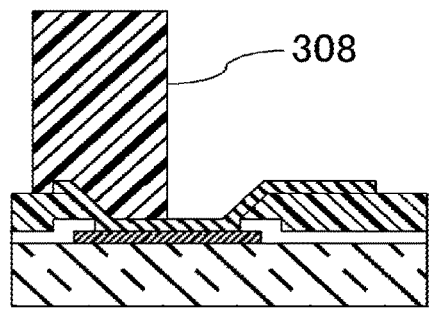
Figure 8C:
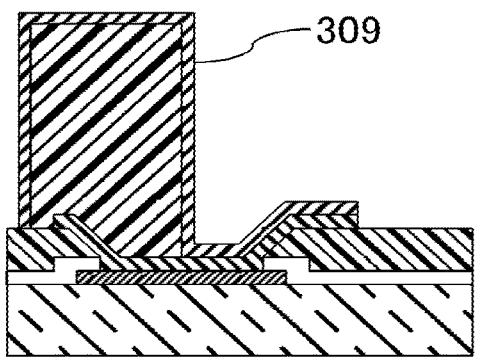
Figure 8D:
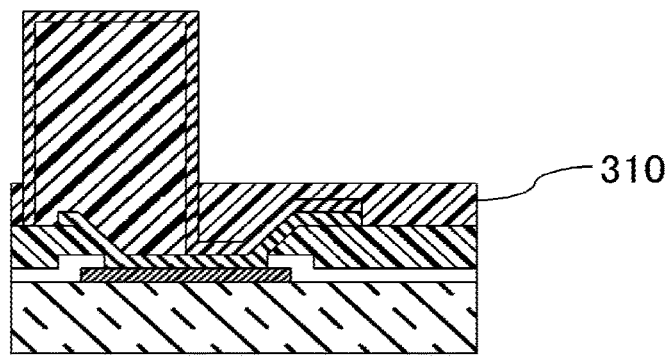

Further, FIG. 8A to FIG. 8D are views for illustrating a manufacturing process according to another embodiment of the present invention in which the anode electrode 309 is laminated so as to extend on the side surface on the back side of the above-mentioned side surface and on the top portion of the fin structure 308. The steps illustrated in FIG. 8A and FIG. 8B are similar to the steps in FIG. 7A and FIG. 7B, and hence description thereof is omitted herein. In this embodiment, in the step illustrated in FIG. 8C, the anode electrode 309 is formed not only on the right side surface of the fin structure 308, but also on the left side surface and the top portion of the fin structure 308. The step of forming the second planarizing film 310, the organic film, the cathode electrode 311, and the sealing film 312 illustrated in FIG. 8D is similar to that in the case described with reference to FIG. 7D. In this embodiment, the anode electrode 309 is formed also on the left side surface of the fin structure 308, and hence the color filter layers 314, 315, and 316 are each formed on a path that light travels after being emitted from the light emitting layers 320, 321, and 322, which are laminated between the anode electrode 309 and the cathode electrode 311 laminated on each of the right side surface and the left side surface of the fin structure 308, and passing through the cathode electrode 311. With this configuration, light emitted from the light emitting layers 320, 321, and 322 laminated on each of the right side surface and the left side surface of the fin structure 308 can be extracted, resulting in enhanced luminance.

Figure 9A:
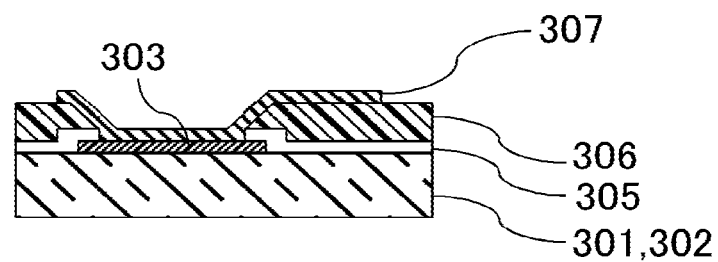
FIG. 9A to FIG. 9C are views for illustrating a flow of manufacturing of an organic electro-luminescent display device according to still another embodiment of the present invention.
Figure 9B:
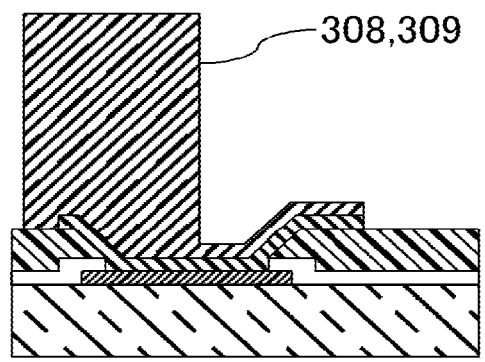
Figure 9C:
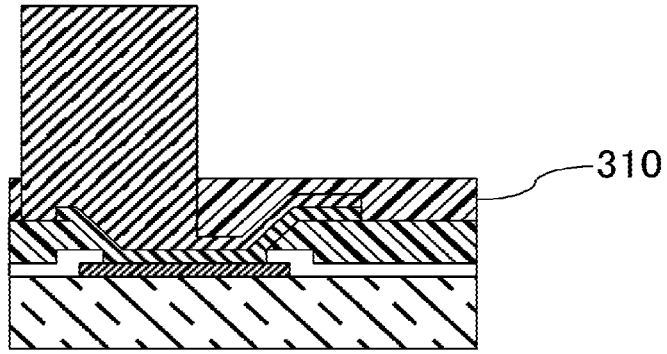

Further, FIG. 9A to FIG. 9C are views for illustrating a manufacturing process according to still another embodiment of the present invention in which the anode electrode 309 is made of the same material as the fin structure 308.

Similarly to the above, the step illustrated in FIG. 9A is similar to the step illustrated in FIG. 7A, and hence description thereof is omitted herein. In the step illustrated in FIG. 9B, the anode electrode 309 is formed so as to cover the connection electrode 307 and such that the thickness of only the region in which the fin structure 308 is formed in the above-mentioned embodiment is increased. With the manufacturing process of this embodiment, the anode electrode 309 and the fin structure 308 can be formed in the same step, and thus the load during manufacture is reduced. In this embodiment, in order to prevent a state in which the connection electrode 307 is excessively etched when the anode electrode 309 is formed to have regions with different thicknesses, the anode electrode 309 may be directly laminated on the drain electrode 303 without forming the connection electrode 307.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electro-luminescent (EL) display device, comprising:
    a substrate;
    a fin structure on the substrate, the fin structure standing upright in a thickness direction of the substrate;
    a first electrode formed on at least a part of a side surface of the fin structure;
    a planarizing film covering the first electrode except for a part of a surface of the first electrode on the side surface of the fin structure;
    an organic film comprising a light emitting layer, which is laminated so as to cover a part of the surface of the first electrode that is not covered by the planarizing film of the fin structure;
    a second electrode that is transparent and is laminated so as to cover a surface of the organic film on the side surface and a top portion of the fin structure;
    a color filter layer that is configured to transmit light having a certain wavelength, and is formed on a path that light travels after being emitted from the light emitting layer and passing through the second electrode and formed at least above the organic film laminated on the side surface of the fin structure; and
    a light blocking layer configured to block light formed above the top portion of the fin structure.

2. The organic EL device according to claim 1, wherein the first electrode is laminated so as to further extend on the top portion and on a side surface on a back side of the part of the side surface of the fin structure, and
    the color filter layer is further formed on a path that light travels after being emitted from the light emitting layer, which is laminated between the first electrode and the second electrode laminated on the side surface on the back side, and passing through the second electrode.

3. The organic EL display device according to claim 1, further comprising a display region comprising a plurality of pixels arranged in a matrix, wherein
    each of the plurality of pixels has a plurality of fin structures.

4. The organic EL display device according to claim 1, wherein
    the organic film is in contact with the part of the surface of the first electrode that is not covered by the planarizing film on the side surface of the fin structure.

5. An organic electro-luminescent (EL) display device, comprising:
- a substrate;
- a first electrode having a fin structure standing upright in a thickness direction of the substrate;
- a planarizing film covering a surface of the first electrode except for a part of a surface of the first electrode on a side surface of the fin structure;
- an organic film comprising a light emitting layer, which is laminated so as to cover a part of the surface of the first electrode that is not covered by the planarizing film of the fin structure;
- a second electrode that is transparent and is laminated so as to cover a surface of the organic film on the side surface and a top portion of the fin structure;
- a color filter layer that is configured to transmit light having a certain wavelength, and is formed on a path that light travels after being emitted from the light emitting layer and passing through the second electrode and formed at least above the organic film laminated on the side surface of the fin structure; and
- a light blocking layer configured to block light formed above the top portion of the fin structure.

6. The organic EL device according to claim 5, wherein the part of the surface of the first electrode that is not covered by the planarizing film extends on the top portion and on a side surface on a back side of the part of the side surface of the fin structure, and
the color filter layer is further formed on a path that light travels after being emitted from the light emitting layer, which is laminated between the first electrode and the second electrode laminated on the side surface on the back side, and passing through the second electrode.

7. The organic EL display device according to claim 5, further comprising a display region comprising a plurality of pixels arranged in a matrix, wherein each of the plurality of pixels has a plurality of fin structures.

8. The organic EL display device according to claim 5, wherein
the organic film is in contact with the part of the surface of the first electrode that is not covered by the planarizing film on the side surface of the fin structure.

9. An organic electro-luminescent (EL) display device, comprising:
- a substrate;
- a fin structure on the substrate, the fin structure standing upright in a thickness direction of the substrate;
- a first electrode formed on at least a part of a side surface of the fin structure;
- a planarizing film covering the first electrode except for a part of a surface of the first electrode on the side surface of the fin structure;
- an organic film comprising a light emitting layer, which is laminated so as to cover a part of the surface of the first electrode that is not covered by the planarizing film of the fin structure; and
- a second electrode that is transparent and is laminated so as to cover a surface of the organic film on the side surface and a top portion of the fin structure.

10. The organic EL display device according to claim 9, further comprising a display region comprising a plurality of pixels arranged in a matrix, wherein each of the plurality of pixels has a plurality of fin structures.

11. The organic EL display device according to claim 9, wherein
the organic film is in contact with the part of the surface of the first electrode that is not covered by the planarizing film on the side surface of the fin structure.

* * * * *